United States Patent [19]

Erdos

[11] Patent Number: 4,953,007
[45] Date of Patent: Aug. 28, 1990

[54] PLASTIC ENCAPSULATED INTEGRATED CIRCUIT PACKAGE WITH ELECTROSTATIC SHIELD

[75] Inventor: George Erdos, Toronto, Canada

[73] Assignee: Linear Technology Inc., Burlington, Canada

[21] Appl. No.: 260,640

[22] Filed: Oct. 21, 1988

[51] Int. Cl.⁵ .......................................... H01L 23/48
[52] U.S. Cl. ........................................ 357/84; 357/72
[58] Field of Search ..................... 357/84, 72, 74, 81

[56] References Cited

FOREIGN PATENT DOCUMENTS 0068638  4/1985  Japan ..................................... 357/84

Primary Examiner—James W. Davie
Attorney, Agent, or Firm—Rogers, Bereskin & Parr

[57] ABSTRACT

A plastic encapsulated integrated circuit package in which a chip is secured to the upper surface of a base and is connected to leads which have their lower surfaces in a plane above that of the bottom of the base. An electrostatic shield is electrically connected to the bottom of the base and underlies the leads without touching them, to reduce crosstalk. The support for the base is integrally connected by a conductive strip to the lead for the ground pin of the chip, to ground the shield. The whole is plastic encapsulated. To permit encapsulation, the shield extends towards but stops short of the dam bars for the leads.

6 Claims, 1 Drawing Sheet

PLASTIC ENCAPSULATED INTEGRATED CIRCUIT PACKAGE WITH ELECTROSTATIC SHIELD

FIELD OF INVENTION

This invention relates to a plastic encapsulated integrated circuit package having an electrostatic shield fabricated therein.

BACKGROUND OF THE INVENTION

The most common low-cost package used by the semiconductor industry is a so-called "dual-in-line plastic package", called DIP. The cost of this package is very low, but for radio frequency (RF) applications an inherent package limitation is the extent to which a signal on one pin can be isolated from any of the other pins. This performance parameter is referred to as "crosstalk". A typical DIP has 76 dB of crosstalk isolation measured at 10 MHz. This is inadequate for many RF applications such as video switching.

For RF applications such as video switching, ceramic packages are commonly used. The ceramic packages consist of a ceramic base into which the integrated circuit chip can be fitted, with slots for the leads to extend therefrom, and with a metal lid which can be assembled over the chip. In this configuration crosstalk isolation of 80 dB or better can be achieved, but the cost of these packages is typically ten times the cost of a DIP package.

SUMMARY OF THE INVENTION

It is therefore an object of the present invention to provide a semi-conductor package with a built-in electrostatic shield, which provides performance approaching that of a ceramic package but at a cost not much greater than that of a DIP. In one of its aspects the present invention provides an integrated circuit package comprising:

(a) an integrated circuit chip, said chip having a plurality of pins including a ground pin, (b) a base having upper and lower surfaces, said chip being adhered to said upper surface of said base, (c) a plurality of leads connected to respective ones of said pins and extending laterally outwardly from said chip beyond said base, each lead having a lower surface, (d) an electrostatic shield adhered to the bottom of said base, said shield having a portion extending laterally outwardly beyond said base and extending beneath at least a portion of said leads for attenuating the electromagnetic field between said leads to reduce crosstalk between said leads, said portion having an upper surface which is located in a plane below that of said lower surfaces of said leads, (e) means electrically connecting said shield to said ground pin of said chip, (f) and a plastic layer enveloping said chip, said base, said shield, and those portions of said leads adjacent said chip, to encapsulate the same.

Further advantages of the invention will appear from the following description, taken together with the accompanying drawings.

DESCRIPTION OF PREFERRED EMBODIMENTS

Figure 1:
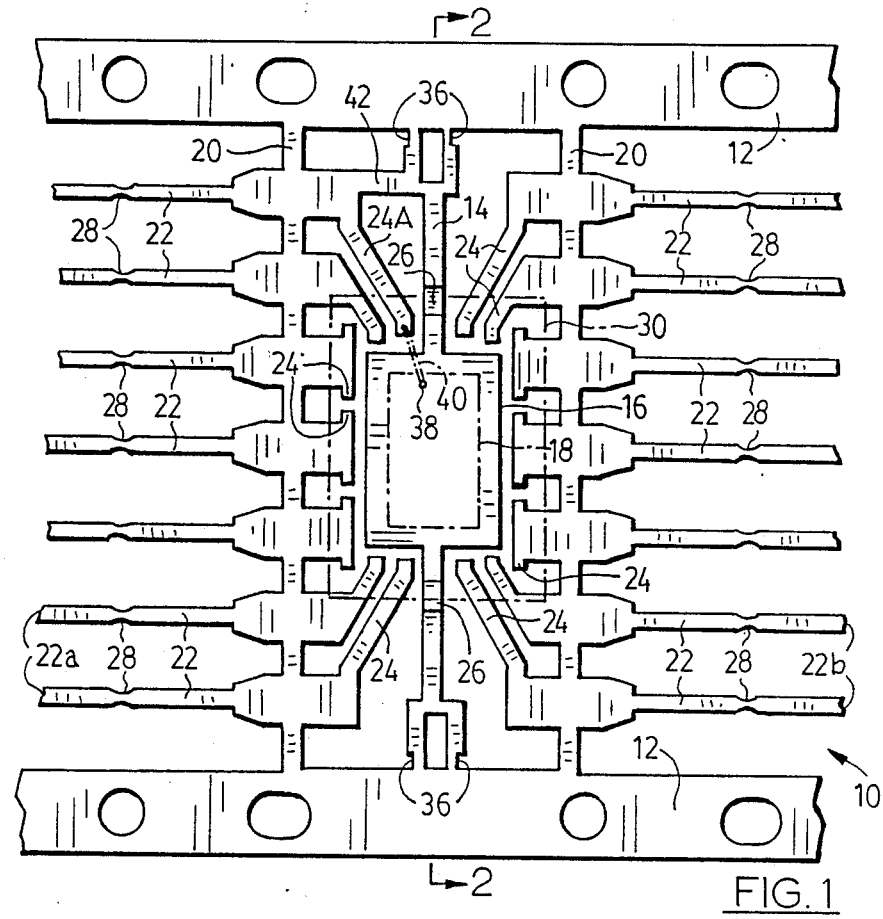
FIG. 1 is a plan view of a portion of a conventional lead frame for an integrated circuit, with the electrostatic shield of the invention shown in dotted lines therein.
Figure 2:
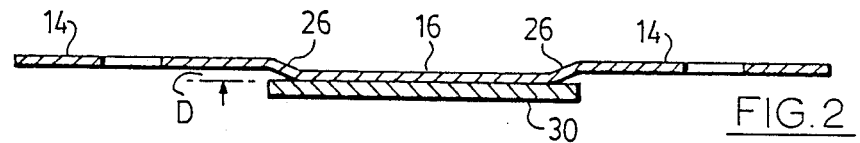
FIG. 2 is a sectional view taken along lines 2—2 of FIG. 1 and showing the electrostatic shield of the invention in full lines.

In FIGS. 1 and 2 a conventional lead frame for an integrated circuit is indicated at 10. The lead frame 10 includes side bars 12 connected by a cross-member 14 to a base or "paddle" 16. An integrated circuit chip, indicated in dotted lines at 18, is conventionally adhered to the paddle 16 by a suitable adhesive. In order that thermal expansion of the lead frame and/or chip will not crack the chip, the lead frame 10 is typically fabricated from a material which has the same thermal coefficient of expansion as the chip 18. Typically the lead frame 10 is made from an alloy of nickel, silicon, manganese and iron as is well known in the industry.

Figure 3:
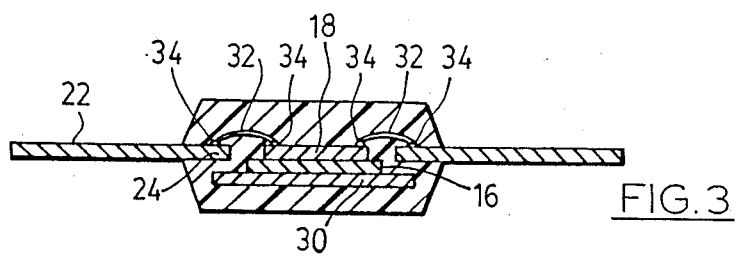
FIG. 3 is a sectional view of an integrated circuit plastic encapsulated package according to the invention.

The lead frame 10 includes a pair of further cross-members 20 on which are mounted a plurality of leads 22. Each lead 22 has a finger 24 which extends close to but is spaced slightly from the paddle 16. The leads 22 are located in the same plane as that of the outer portions of cross-member 14. As shown in FIGS. 2 and 3, this plane is located above that of the paddle 16. The plane of the paddle 16 is depressed below that of the leads 22 and outer portions of cross-member 14 by two angled portions or bends 26 in the cross-member 14. The bends 26 are located closely adjacent the paddle 16.

At their outer ends, the leads 22 are connected to leads 22a, 22b which extend toward other paddles (not shown) in the lead frame 10. After the assembly and encapsulation to be described, the leads 22a, 22b are cut away at the weakened points 28 as the complete integrated circuit packages are removed from the lead frame.

The cross-members 20 which support the leads 22 also serve as dam bars during the plastic encapsulation process, as will be described.

The electrostatic shield 30 of the invention is typically made of the same metal alloy as the lead frame 10 and is secured to the bottom of the paddle 16. The electrostatic shield 30 may be secured to the paddle 16 either by spot welding, or by an electrically conductive glue. The electrostatic shield 30 is normally of the same shape as the paddle 16 (rectangular) and extends outwardly laterally beyond the paddle 16 to underlie a portion of each of the fingers 24 of the leads 22. However, the shield 30 does not extend as far outwardly as the dam bars 20 or the side bars 12.

In assembly, the integrated circuit chip 18, after being mounted on the paddle 16, is connected to the fingers 24 by connecting wires indicated at 32 in FIG. 3. The connecting wires 32 are typically bonded at points 34.

After the connecting wires 32 have been installed as shown in FIG. 3, the combination of the shield 30, paddle 16, integrated circuit chip 18, connecting wires 32 and fingers 24 of the leads 22 are plastic encapsulated by a pair of mold halves (not shown) which are closed over the top and bottom of the lead frame 10. Specifically, the mold halves close over the side bars 12 and the dam bars 20. Plastic is then injected into the mold. During the plastic molding process, the dam bars 20 prevent plastic from flowing laterally outwardly beyond the dam bars. The side bars 12 perform the same function at the sides of the lead frame. Typically, a thermosetting single component plastic epoxy is used, which cures after it has been heated, or alternatively a thermoplastic may be used. Typically, the total thickness of the resultant package is about 0.135 inches, although this thickness can vary between about 0.110 and 0.160 inches.

The above dimensions assume a lead frame thickness of about 0.010 inches, an electrostatic shield thickness of about 0.010 inches, and a dimension D (the difference in level between the bottom of the leads 22 and the top of the paddle 16) of about 0.015 inches.

Preferably the electrostatic shield 30 projects as far as possible outwardly beyond the innermost portions of the lead fingers 24, but terminates inwardly of the dam bars 20 and side bars 12 sufficiently so as not to split the package in half. It is found sufficient if the shield 30 projects laterally to within 0.030 inches of the dam bars 20.

After the plastic encapsulation has been completed, the completed device is removed from the lead frame by cutting the leads 22 at the weakened areas 28 and by cutting the cross-member 14 at points 36. At the same time, the dam bars 20 are cut away (i.e. the portions between the leads 22 and between the leads and side bars 12 are removed) to remove unwanted connections between the leads.

It is essential that the shield 30 be grounded, since if it were left to float electrically, the device would not function properly. The required grounding is provided in a simple manner. The ground pin of the chip 18 is indicated at 38 in FIG. 1. A connection wire 40 is bonded between pin 38 and one of the lead fingers, namely finger 24A. Finger 24A is integrally connected by a conductive strip 42 to the cross-member 14 near one of the side bars 12. This arrangement avoids the need for an operation to make an extra connection, since connecting wire 40 which connects lead finger 24A to ground pin 38 must normally be installed whether or not a shield 30 is used.

In practice, it is found that the package described is inexpensive and yet provides a consistent improvement of 3 to 4 dB over a standard dual-in-line plastic package. The difference is sufficient to permit the new package to be used in many video switch and similar RF applications without the need for a costly ceramic package. It is found that the electrostatic shield 30 of the invention, when it underlies a short portion of the leads 22, shorts out or attenuates the RF field which would otherwise exist between adjacent leads 22 and thereby reduces the level of crosstalk.

It is of course important that the upper surface of the shield 30 be physically located at a lower level than the lower surface of the fingers 24, so that the shield 30 will not contact the leads themselves. In addition, provided that the shield 30 terminates laterally sufficiently short of the dam bars 20, it is found that the shield 30 does not interfere with the plastic encapsulation process, and that the plastic will flow adequately in order to encapsulate the chip and the leads fully. However, since the spaces into which the plastic must flow are now made narrower than in the past, it is necessary to ensure during the encapsulation process that the plastic is sufficiently free flowing (i.e. sufficiently low viscosity) to fill all of the spaces between the mold halves.

Figure 4:
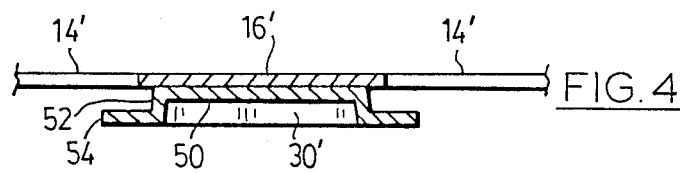
FIG. 4 is a view similar to that of FIG. 2 but showing a modified version of the invention.

If desired, and as shown in FIG. 4 where primed reference numerals indicate parts corresponding to those of FIGS. 1 to 3, the paddle 16' can be formed in the same plane as cross-member 14', and the shield 30' can be downwardly dished. In this event, the centre part 50 of the shield 30' is conductively fixed to the bottom of the paddle 16'. A downwardly extending rim 52 encircles the center part 50, and a flange 54 projects outwardly from rim 52. The flange 54 underlies the wires 32 and fingers 24 to attenuate any field therebetween. The rim and flange 52,54 can extend on two, three or four sides depending on where there are leads to be underlaid.

I claim:
1. An integrated circuit package comprising:
   (a) an integrated circuit chip, said chip having a plurality of pins including a ground pin,
   (b) a thin conductive metal base having upper and lower surfaces, said chip being adhered to said upper surface of said base,
   (c) a plurality of leads connected to respective ones of said pins and extending laterally outwardly from said chip beyond said base, each lead having a lower surface,
   (d) each lead having an inner finger formed of the same material as said base, said finger being spaced from said base by a gap, and a connecting member connecting said pins to said fingers,
   (e) an electrostatic shield directly adhered to the bottom of said base by an adhering material, said shield having a portion extending laterally outwardly beyond said base and extending beneath at least a portion of said leads and underlying a portion of said fingers for attenuating the electromagnetic field between said leads to reduce crosstalk between said leads, said portion having an upper surface which is located in a plane below that of said lower surfaces of said leads,
   (f) means electrically connecting said shield to said ground pin of said chip,
   (g) said means electrically connecting said shield to said ground pin comprising a conductive member formed integrally with said base and extending laterally therefrom, and a conductive strip connecting said conductive member to one of said fingers, said one finger being connected to said ground pin of said chip, said conductive member being integral with said conductive strip and said one lead finger, said adhering material being electrically conductive so that said shield is electrically connected to said base;
   (h) and a plastic layer completely enveloping said chip, said base, said shield, and those portions of said leads adjacent said chip, to fully encapsulate the same.

2. A device according to claim 1 wherein said conductive member has an outer section located in the same plane as that of said fingers and an angled inner section connecting said outer section to said base to dispose the lower surface of said base in a plane below that of the lower surfaces of said fingers, said shield being substantially flat.

3. A device according to claim 1 wherein said lead fingers are formed as part of a lead frame having a pair of side bars and a plurality of said bases between said side bars, said conductive member extending laterally on both sides of said base between said side bars and constituting a support for said base before said device is removed from said lead frame.

4. A device according to claim 1 wherein said lead fingers are formed as part of a lead frame having a pair of side bars and a plurality of said bases between said side bars, said conductive member extending laterally on both sides of said base between said side bars and constituting a support for said base before said device is removed from said lead frame.

5. A device according to claim 1 wherein said shield is formed from material having the same thermal coefficient of expansion as said base.

6. An integrated circuit package comprising:
 (a) an integrated circuit chip, said chip having a plurality of pins including a ground pin,
 (b) a base having upper and lower surfaces, said chip being adhered to said upper surface of said base,
 (c) a plurality of leads connected to respective ones of said pins and extending laterally outwardly from said chip beyond said base, each lead having a lower surface,
 (d) an electrostatic shield adhered to the bottom of said base, said shield having a portion extending laterally outwardly beyond said base and extending beneath at least a portion of said leads for attenuating the electromagnetic field between said leads to reduce crosstalk between said leads, said portion having an upper surface which is located in a plane below that of said lower surfaces of said leads,
 (e) means electrically connecting said shield to said ground pin of said chip,
 (f) and a plastic layer enveloping said chip, said base, said shield, and those portions of said leads adjacent said chip, to encapsulate the same;
 (g) each lead having an inner finger formed of the same material as said base, said finger being spaced from said base by a gap, and a connecting member connecting said pins to said fingers, said portion of electrostatic shield extending laterally beyond said connecting members and underlying a portion of said fingers;
 (h) said means electrically connecting said shield to said ground pin comprising a conductive member formed integrally with said base and extending laterally therefrom, and a conductive strip connecting said conductive member to one of said fingers, said one finger being connected to said ground pin of said chip, said shield being electrically connected to said base; and
 (i) said conductive member being flat and disposing said base in the same plane as said fingers, said shield being of downwardly dished configuration having a centre portion fixed to said base and a downwardly extending rim, said portion of said shield being constituted by a flange projecting outwardly from said rim.

* * * * *